(12) United States Patent
Jung et al.

(10) Patent No.: US 7,394,701 B2
(45) Date of Patent: Jul. 1, 2008

(54) CIRCUIT AND METHOD OF DRIVING A WORD LINE BY CHANGING THE CAPACITANCE OF A CLAMP CAPACITOR TO COMPENSATE FOR A FLUCTUATION OF A POWER SUPPLY VOLTAGE LEVEL

(75) Inventors: Jong-Hoon Jung, Yongin-si (KR);
Myoung-Kyu Seo, Suwon-si (KR);
Hyo-Sang Lee, Yongin-si (KR);
Hoon-Jin Bang, Seoul (KR)

(73) Assignee: Samsung Electronics., Ltd., Gyeonggi-do (KR)

( * ) Notice: Subject to any disclaimer, the term of this patent is extended or adjusted under 35 U.S.C. 154(b) by 197 days.

(21) Appl. No.: 11/452,899

(22) Filed: Jun. 15, 2006

(65) Prior Publication Data

US 2007/0008780 A1 Jan. 11, 2007

(30) Foreign Application Priority Data

Jul. 5, 2005 (KR) .................... 10-2005-0060325

(51) Int. Cl.
*G11C 16/08* (2006.01)
*G11C 16/30* (2006.01)
*G11C 16/26* (2006.01)

(52) U.S. Cl. .................. 365/185.23; 365/202; 365/227; 365/189.09; 365/230.06

(58) Field of Classification Search ............ 365/185.23, 365/189.09, 202, 226, 230.06, 227
See application file for complete search history.

(56) References Cited

U.S. PATENT DOCUMENTS

| 5,197,033 | A | * | 3/1993 | Watanabe et al. ............ 365/226 |
| 5,307,315 | A | * | 4/1994 | Oowaki et al. ......... 365/189.09 |
| 5,394,077 | A | * | 2/1995 | Atsumi ....................... 323/223 |
| 6,134,146 | A |   | 10/2000 | Bill et al. |
| 7,301,830 | B2 | * | 11/2007 | Takahashi et al. ........... 365/194 |
| 2002/0021159 | A1 | * | 2/2002 | Takahashi ................... 327/283 |
| 2002/0033721 | A1 | * | 3/2002 | Tachimori ................... 327/158 |

FOREIGN PATENT DOCUMENTS

| KR | 10-287545 | 1/2001 |
| KR | 10-2003-0046687 | 6/2003 |

\* cited by examiner

*Primary Examiner*—J. H. Hur
(74) *Attorney, Agent, or Firm*—Harness, Dickey & Pierce

(57) ABSTRACT

A word line driving circuit includes a read voltage generator and a word line driver. The read voltage generator precharges a clamp capacitor with a power supply voltage to stably generate a read voltage in response to a read command. A capacitance of the clamp capacitor is varied to compensate for a fluctuation of a power supply voltage level. The word line driver distributes electric charges precharged in the clamp capacitor to a word line in response to a word line selecting signal. Therefore, the word line driving circuit reduces unnecessary power consumption in a standby mode by operating the word line rapidly with charge sharing in a read mode.

14 Claims, 3 Drawing Sheets

CIRCUIT AND METHOD OF DRIVING A WORD LINE BY CHANGING THE CAPACITANCE OF A CLAMP CAPACITOR TO COMPENSATE FOR A FLUCTUATION OF A POWER SUPPLY VOLTAGE LEVEL

CLAIM FOR PRIORITY

This application claims the benefit of priority under 35 USC § 119 to Korean Patent Application No. 2005-60325, filed on Jul. 5, 2005, the entire contents of which are herein incorporated by reference.

BACKGROUND OF THE INVENTION

1. Field of the Invention

Example embodiments of the present invention relate to a circuit and a method of driving a word line, and more particularly to a circuit and a method of driving a word line in a read mode of a nonvolatile memory device embedded on a System-on-Chip (SoC).

2. Description of the Related Art

Generally, it is desirable for a portable device, for example, a mobile terminal, to be light, small and relatively simple. Thus, a System-on-Chip (SoC) technique, which may implement a central processing unit (CPU), a digital signal processor (DSP), a memory, etc. on one chip, has been adapted for use in conventional portable devices, for example, mobile terminals. The memory implemented on a SoC generally includes a nonvolatile memory, for example, a flash memory, as well as volatile memory, for example, a dynamic random access memory (DRAM) or a static random access memory (SRAM). A flash memory may used to safely store data, for example, identification code values, that are encoded and/or decoded for communication security even when a power supply is deactivated due to, for example, an exhausted battery, etc.

In conventional devices, a NOR-type flash memory having a high speed is generally used as the flash memory implemented on a SoC.

Such a flash memory may have three operation modes, e.g., an erase mode, a program mode and a read mode. Voltage levels applied into a cell may differ depending on the operation mode of the flash memory. Thus, a word line voltage, which may be applied into each cell, may be varied depending on the operation mode.

A constant read voltage (for example, about 2.6 V), which may maximize a difference between an on-cell current and an off-cell current, may be used and/or required for a flash memory to accurately detect an on-cell and an off-cell during a read operation.

A read voltage should maintain a substantially constant voltage level that is relatively insensitive to fluctuations of an external power source, temperature fluctuations and process variations; because a fluctuation of the read voltage may cause an incorrect reading of the on-cell and the off-cell. Thus, generally, the read voltage is generated from an internal read voltage generator, which may be relatively unaffected by fluctuations of an external power source, temperature fluctuations and process variations.

A conventional read voltage generator may compare a reference voltage and a read voltage by a constant resistance ratio to maintain a substantially constant level of voltages. However, due to characteristics of circuit operations, a setting time greater than about 200 ns may be required. Thus, in a case where the read voltage is generated after a read command, a conventional read voltage generator may not satisfy a flash memory access time, which may be about 50 ns.

Therefore, a conventional read voltage generator is typically operated during a standby mode and may generate a prescribed read voltage in advance. However, this conventional process may result in increased power consumption during the standby mode.

SUMMARY OF THE INVENTION

Example embodiments of the present invention are provided to reduce and/or obviate one or more problems due to limitations of the related art.

Example embodiments of the present invention provide a circuit for driving a word line. The circuit for driving the word line may reduce unnecessary power consumption in a standby mode by operating word lines rapidly using charge sharing in a read mode.

Example embodiments of the present invention provide a method of driving a word line. The method of driving a word line may reduce unnecessary power consumption in a standby mode by operating word lines rapidly using charge sharing in a read mode.

An example embodiment of the present invention provides a word line driving circuit. The word line driving circuit may include a read voltage generator configured to precharge a clamp capacitor with a power supply voltage in response to a read command to stably generate a read voltage in which a capacitance of the clamp capacitor is changed so that to compensate for a fluctuation of a power supply voltage; and a word line driver configured to distribute electric charges precharged in the clamp capacitor to a word line in response to a word line selecting signal.

According to an example embodiment of the present invention, a read voltage generator may include a level detector configured to detect a fluctuation of the power supply voltage level to generate a level detecting signal in response to the read command, and a charge sharing clamp circuit configured to precharge the clamp capacitor in response to the level detecting signal to generate the read voltage. Because the capacitance of the clamp capacitor is changed, that is, in inverse proportion to the fluctuation of the power supply voltage level, the fluctuation of the power supply voltage level is compensated for by the changed capacitance and electric charges may remain substantially constant.

According to an example embodiment of the present invention, a level detector may include a read control transistor coupled between the power supply voltage and a first node, and configured to switch in response to the read command; a voltage divider including n resistors coupled in series between the first node and a ground electrode, and configured to output respective n−1 voltage-divided signals, where n is a natural number greater than one; and n−1 comparators each configured to compare one of the n−1 voltage-divided signals with a reference signal to generate n−1 compare signals.

According to an example embodiment of the present invention, a charge sharing clamp circuit may include a precharge transistor coupled between the power supply voltage and a second node, and configured to be switched in response to a precharge signal; a charge sharing capacitor coupled between the second node and the ground electrode; n−1 unit clamp capacitors coupled in parallel between the second node and the ground electrode; and n−1 clamp transistors each of which is coupled between the second node and the n−1 unit clamp capacitors and configured switch in response to a corresponding one of the n−1 compare signals.

According to an example embodiment of the present invention, the fluctuation of a power supply voltage may be detected as a correct digital value and a variation of the capacitance may be controlled by a digital value.

According to an example embodiment of the present invention, clamp transistors may include PMOS transistors and the number of the PMOS transistors that are activated may increase as the power supply voltage level decreases.

According to an example embodiment of the present invention, a word line driver may include a junction capacitor coupled between the power supply voltage and the second node; an inverter coupled between the second node and the ground electrode, and configured to invert the word line selecting signal to output an inverted word line selecting signal; and a pass transistor configured to transmit the inverted word line selecting signal output from the inverter to a word line. The pass transistor may be either a self-boosting type or a hybrid type combining self boosting and pumping.

An example embodiment of the present invention provides a method of driving a word line. The method of driving the word line may include detecting a level of a power supply voltage in response to a read command; changing a capacitance in response to the detected level of the power supply voltage to compensate for a fluctuation of the power supply voltage; precharging the clamp capacitor with the power supply voltage; and distributing electric charges precharged in the clamp capacitor to the word line in response to a word line selecting signal.

According to an example embodiment of the present invention, detecting the level of the power supply voltage may include providing the power supply voltage in response to a read command; generating n voltage-divided signals in response to the provided power supply voltage, where n is a natural number greater than one; and comparing the n voltage-divided signals with a reference signal to generate n compare signals.

According to an example embodiment of the present invention, changing the capacitance may include decreasing a number of activated n clamp transistors, when the level of power supply voltage increases, in response to the n compare signals, the n clamp transistors are coupled to the n unit clamp capacitors included in the clamp capacitor; and increasing the number of the activated n clamp transistors, when the level of power supply voltage decreases, in response to the n compare signals. The capacitance of the n unit clamp capacitors is varied according to the number of the activated n clamp transistors.

According to an example embodiment of the present invention, distributing the electric charges may include precharging a pass transistor; providing electric charges that are integrated in the clamp capacitor and the charge sharing capacitor to an input stage of the pass transistor in response to the word line selecting signal; self-boosting the pass transistor by the electric charges provided to the input stage of the pass transistor; and distributing the electric charges to the word line through the self-boosted pass transistor.

An example embodiment of the present invention provides a read voltage generator. The read voltage generator may include a level detector configured to detect a fluctuation of a power supply voltage level to generate a level detecting signal in response to a read command to stably generate a read voltage; and a charge sharing clamp circuit configured to precharge a clamp capacitor in response to the level detecting signal. The capacitance of the clamp capacitor is varied to compensate for the fluctuation of the power supply voltage level.

BRIEF DESCRIPTION OF THE DRAWINGS

Example embodiments of the present invention will become more apparent to those of ordinary skill in the art from the following description of example embodiments of the present invention considered in combination with the attached drawings, wherein like elements are represented by like reference numerals. It is noted that the drawings are for explanatory purposes and thus, do not limit the example embodiments of the present invention.

DESCRIPTION OF THE EXAMPLE EMBODIMENTS OF THE PRESENT INVENTION

Hereinafter, example embodiments of the present invention will be explained in detail with reference to the accompanying drawings.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
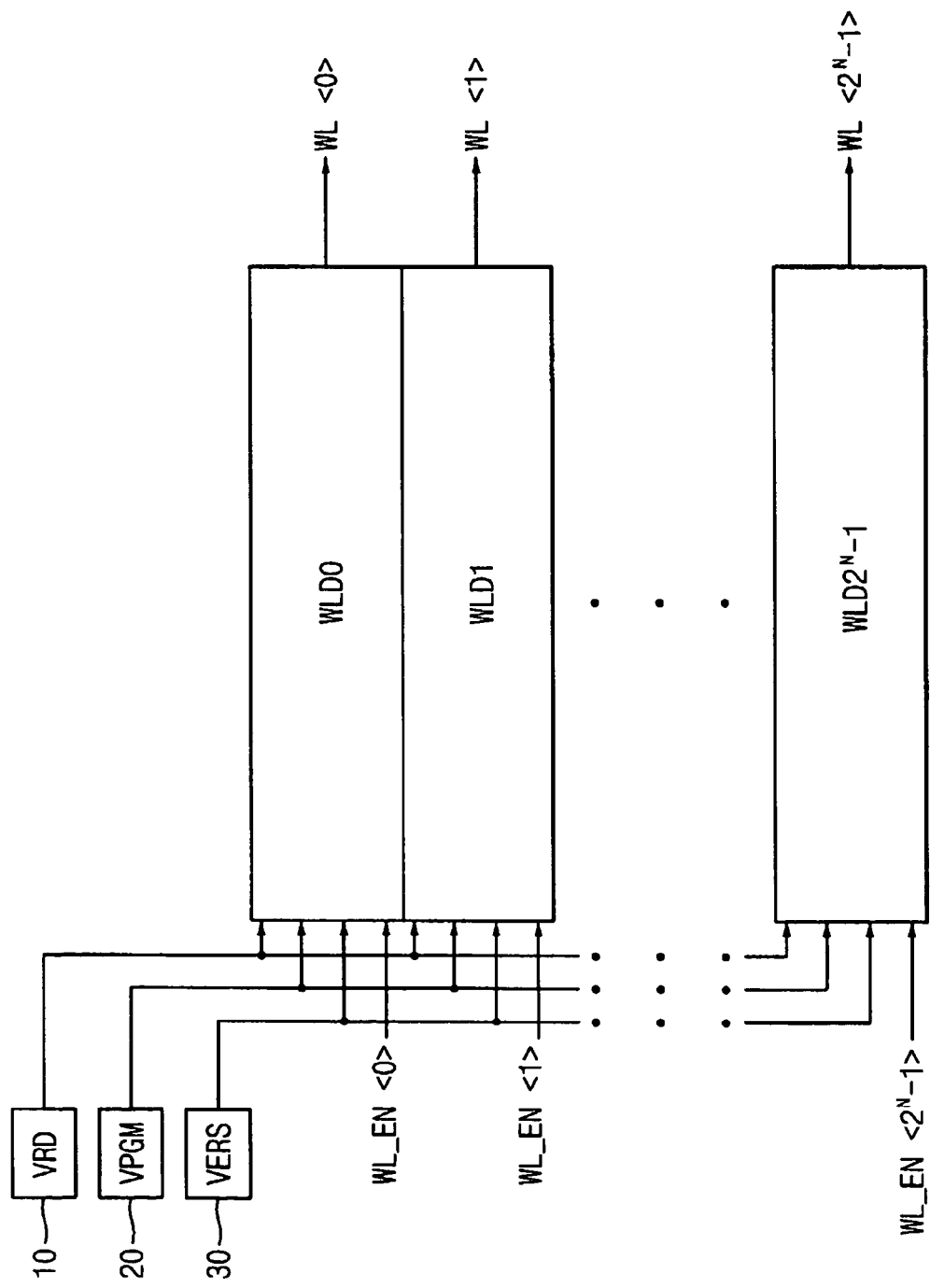
FIG. 1 is a block diagram illustrating a word line decoder of a flash memory according to an example embodiment of the present invention.
Figure 2:
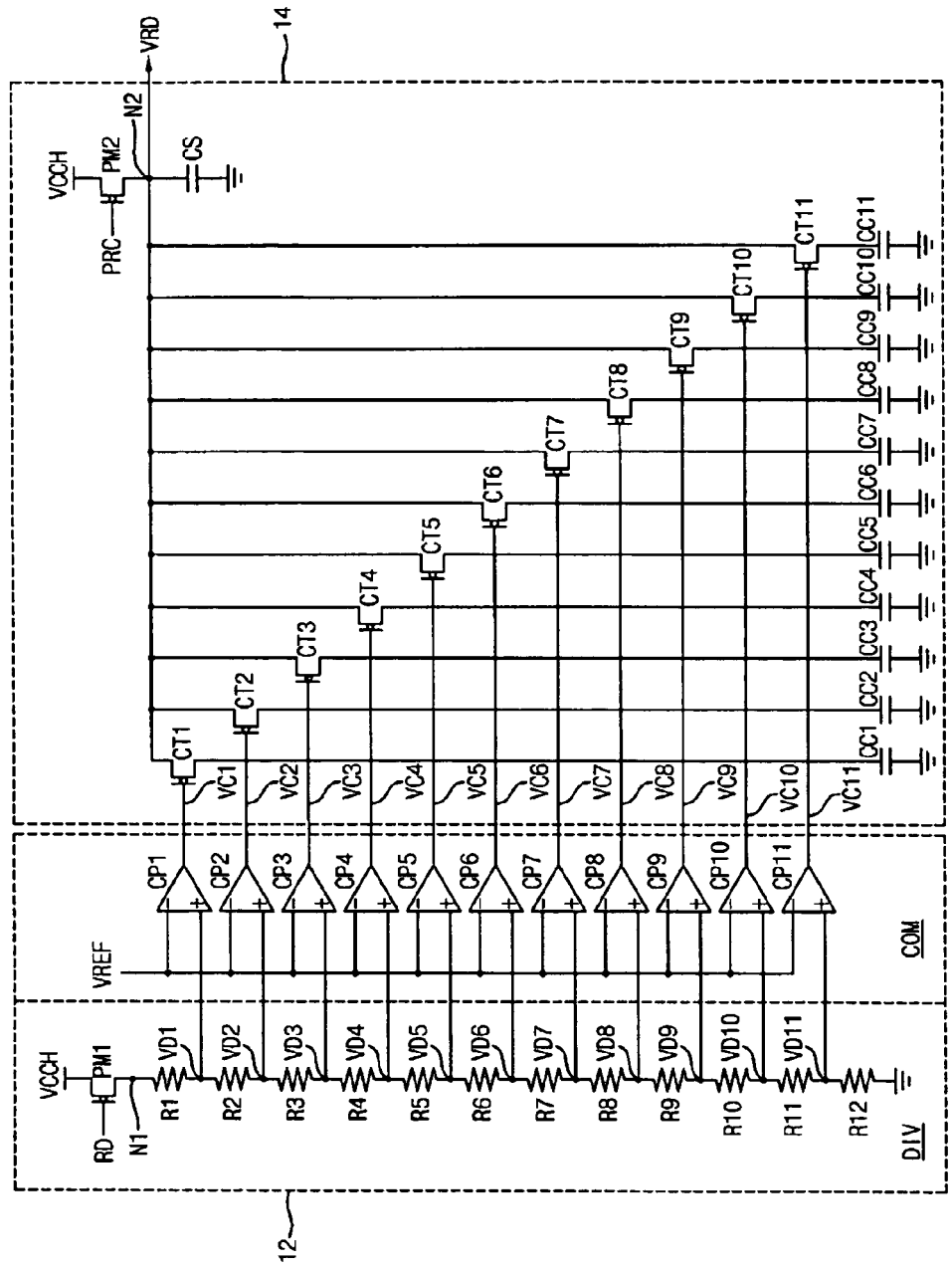
FIG. 2 is a circuit diagram illustrating a read voltage generator of FIG. 1, according to an example embodiment of the present invention.
Figure 3:
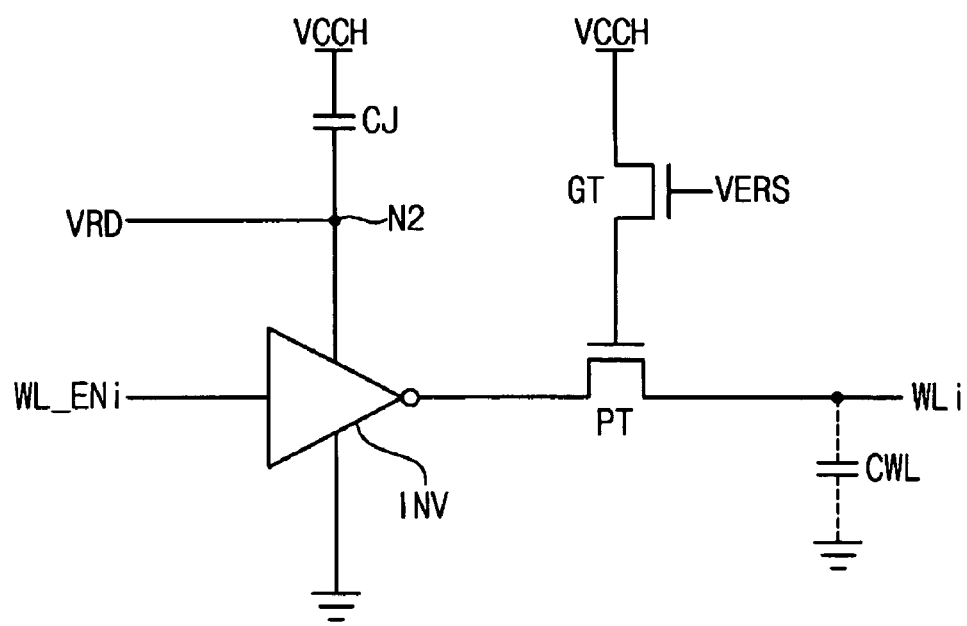
FIG. 3 is a circuit diagram illustrating a word line driver of FIG. 1, according to an example embodiment of the present invention.

FIG. 1 is a block diagram illustrating a word line decoder of a flash memory according to an example embodiment of the present invention; FIG. 2 is a circuit diagram illustrating a read voltage generator of FIG. 1 according to an example embodiment of the present invention; and FIG. 3 is a circuit diagram illustrating a word line driver of FIG. 1 according to an example embodiment of the present invention. According to an example embodiment of the present invention, a flash memory may be embedded on a System-on-Chip (SoC) and may be adapted to an application that is provided with a power supply voltage (for example, VCCH=3.3 V) higher than a read voltage (for example, VRD=2.6 V).

Referring to FIG. 1, a word line decoder may include $2^N$ word line drivers WLD0 through WLD$2^N$−1 in order to drive $2^N$ word lines. The word line decoder may be configured to decode an N-bit row address to activate one of the 2 word line drivers to drive a corresponding word line WLi. Three voltages VRD, VPGM and VERS may be provided to the word line drivers from a read voltage generator 10, a programming voltage generator 20 and an erase voltage generator 30, respectively.

Referring to FIG. 2, a read voltage generator 10 may include a level detector 12 and a charge sharing clamp circuit 14.

The level detector 12 may include a voltage divider DIV and a comparator circuit COM. The voltage divider DIV may include a read control transistor PM1 and one or more resistors. For example, the voltage divider DIV may include twelve resistors R1 through R12 as shown in FIG. 2. The read control transistor PM1 may be coupled between a power supply voltage VCCH and a first node N1 and may be switched in response to a read command RD. The twelve resistors R1 through R12 may be coupled in series between the first node N1 and a ground electrode. The voltage divider DIV may output eleven voltage-divided signals VD1 through VD11. For example, outputs may be provided, each of which is connected between two of the twelve resistors. The comparator circuit COM may include one or more comparators. For example, the comparator circuit COM may include eleven comparators CP1 through CP11 as shown in FIG. 2. Each of the eleven comparators CP1 through CP 11 may compare one of the eleven voltage-divided signals VD1 through VD11 with a reference signal VREF and may generate eleven compare signals VC1 through VC11.

A comparator CPi may output a corresponding compare signal VCi having a low level if a voltage-divided signal VDi is lower than a reference signal VREF, and may output a compare signal VCi having a high level if a voltage-divided signal VDi is higher than the reference signal VREF. For example, if the voltage-divided signal VD11 is higher than the reference signal VREF, all of the compare signals VC1 through VC11 may be output with a high level because according to the configuration shown in FIG. 2, the voltage level of VD11 has the lowest voltage level of the voltage divided signals VD1 through VD11. Further, if the voltage-divided signal VD1 is lower than the reference signal VREF, all of the compare signals VC1 through VC11 are output with a low level because according to the configuration shown in FIG. 2, the voltage level of VD1 has the highest voltage level of the voltage divided signals VD1 through VD11. Therefore, according to an example embodiment of the present invention as shown in FIG. 2, the level detector 12 may detect twelve voltage levels.

A charge sharing clamp circuit 14 may include a precharge transistor PM2, a charge sharing capacitor CS, one or more unit clamp capacitors and one or more clamp transistors. As shown in FIG. 2, the charge sharing clamp circuit 14 may include eleven unit clamp capacitors CC1 through CC11 and eleven clamp transistors CT1 through CT11. The precharge transistor PM2 may be coupled between a power supply voltage VCCH and a second node N2, and may be switched in response to a precharge signal PRC. The eleven unit clamp capacitors CC1 through CC11 may be coupled in parallel between the second node N2 and the ground electrode. The eleven clamp transistors CT1 through CT11 may be coupled between the second node N2 and the eleven unit clamp capacitors CC1 through CC11 and may each be switched in response to a corresponding compare signal of the eleven compare signals VC1 through VC11. The clamp transistors CT1 through CT11 may be configured with at least one PMOS and/or NMOS transistor. For example, the clamp transistors CT1 through CT11 shown in FIG. 2 may be PMOS transistors. The clamp transistors CT1 through CT11 may be activated if a compare signal is a low level and deactivated if the compare signal is a high level.

A total capacitance Ct at the second node N2 may be represented by Equation 1:

$$Ct = Cs + nCc \qquad (1)$$

where Cs is a capacitance of a charge sharing capacitor, Cc is a capacitance of a unit clamp capacitor and n represents the number of the clamp transistors that are activated.

According to an example embodiment of the present invention, all of the clamp transistors CT1 through CT11 may be activated when a power supply voltage VCCH sufficiently decreases so that all of the compare signals are in a low state. Thus, Ct=Cs+11Cc may be derived. Further, all of the clamp transistors CT1 through CT11 may be deactivated when the power supply voltage VCCH sufficiently increases so that all of the compare signals are in a high state. Thus, Ct=Cs may be derived. Accordingly, a value of Ct becomes larger as the level of the power supply voltage decreases, and the value of Ct becomes smaller as the level of the power supply voltage increases.

Therefore, a precharged charge quantity (Q=CV) may be maintained substantially constant. Because the precharged charge quantity may be maintained substantially constant, a substantially constant read voltage VRD may be provided to the second node N2 according to an example embodiment of the present invention.

Referring to FIG. 3, a word line driver WLDi may include a junction capacitor CJ, a CMOS inverter INV and a pass transistor PT. The junction capacitor CJ may be coupled between a power supply voltage VCCH and a second node N2. The CMOS inverter INV may be coupled between the second node N2 and a ground electrode. The CMOS inverter INV may receive, invert and output a word line selecting signal WL_ENi. The pass transistor PT may transmit the output signal from the CMOS inverter INV to a word line WLi. In addition, the word line driver WLDi may include a gate transistor GT that may precharge a gate of the pass transistor PT to drive the pass transistor PT in a self-boosting process. The gate transistor GT may precharge the gate of the pass transistor PT up to about 3.3 V in response to an erase voltage VERS, for example.

According to an example embodiment of the present invention, a read voltage VRD may be applied to an output stage of the inverter INV if the word line selecting signal WL_ENi in an active state. The active state may be a low state. The read voltage VRD may then be provided to the word line WLi.

Because the word line WLi has a parasitic capacitance CWL, electric charges that are integrated in the clamp capacitors CC1 through CC11 and the charge sharing capacitor CS may be distributed via the inverter to the parasitic capacitance CWL. That is, because the charge quantity remains constant irrespective of a fluctuation of the power supply voltage VCCH, a charge quantity distributed to a word line may also be controlled to be relatively constant.

In a driving circuit according to an example embodiment of the present invention, a transistor PM1 may be activated in response to the read command RD if a read control signal becomes an activated level, for example, a low level. Then, a power supply voltage may be applied to the voltage divider DIV. The applied power supply voltage may be divided by a resistor array and voltage-divided signals may be generated. Each of the comparators of the comparator circuit COM may receive a corresponding voltage-divided signal and may compare the voltage-divided signal with the reference signal to generate the compare signal. The compare signal may have a value related to the power supply voltage level.

The clamp transistors may be activated or deactivated in response to a detected compare signal. The unit clamp capacitors coupled to activated clamp transistors may be connected to the second node. Thus, a total capacitance at the second node N2 may be expressed as a sum of the unit clamp capacitors coupled with the charge sharing capacitor.

The precharge transistor PM2 may be activated in response to a precharge signal PRC after the capacitance at the second node N2 is set so that the fluctuation of the power supply voltage level may be compensated for. The capacitors coupled to the second node N2 may be charged through the activated precharge transistor PM2.

When the word line selecting signal WL_ENi is applied while the second node N2 is precharged, a read voltage of for example, about 2.6 V may be generated at the output stage of the inverter INV by the precharged charge at the second node N2. Then, a voltage at the gate of the pass transistor PT may increase from a precharged voltage of about 3.3 V to about 5.8 V by a self-boosting, thereby activating the pass transistor PT. Thus, the read voltage may be applied to the word line WLi through the turned-on pass transistor PT.

Therefore, a word line selected in a read mode may be driven with a substantially constant voltage, for example, 2.6 V, irrespective of the fluctuation of the power supply voltage.

Accordingly, example embodiments of the present invention may reduce unnecessary power consumption in a standby mode by rapidly operating word lines with charge sharing in a read mode of a flash memory embedded in the SoC, etc. In addition, the charge that is to be distributed may be maintained substantially constant, by changing a capacitance to compensate for a fluctuation of the power supply voltage level.

Having thus described example embodiments of the present invention, it is to be understood that the invention is not to be limited by particular details set forth in the above description and many apparent variations of example embodiments of the present invention are possible without departing from the spirit or scope the present invention.

What is claimed is:

1. A word line driving circuit comprising:
   a read voltage generator configured to precharge a clamp capacitor with a power supply voltage in response to a read command to stably generate a read voltage, a capacitance of the clamp capacitor being changed to compensate for a fluctuation of a power supply voltage level; and
   a word line driver configured to distribute electric charges precharged in the clamp capacitor to a word line in response to a word line selecting signal.

2. The word line driving circuit of claim 1, wherein the read voltage generator comprises:
   a level detector configured to detect the fluctuation of the power supply voltage level to generate a level detecting signal in response to the read command; and
   a charge sharing clamp circuit configured to precharge the clamp capacitor in response to the level detecting signal to generate the read voltage.

3. The word line driving circuit of claim 2, wherein the level detector comprises:
   a read control transistor coupled between the power supply voltage and a first node, and configured to switch in response to the read command;
   a voltage divider including n resistors coupled in series between the first node and a ground electrode, and configured to output n−1 voltage-divided signals, where n is a natural number greater than one; and
   n−1 comparators each configured to compare one of the n−1 voltage-divided signals with a reference signal to generate n−1 compare signals.

4. The word line driving circuit of claim 3, wherein the charge sharing clamp circuit comprises:
   a precharge transistor coupled between the power supply voltage and a second node, and configured to be switched in response to a precharge signal;
   a charge sharing capacitor coupled between the second node and the ground electrode;
   n−1 unit clamp capacitors coupled in parallel between the second node and the ground electrode; and
   n−1 clamp transistors each of which is coupled between the second node and one of the n−1 unit clamp capacitors and configured to switch in response to a corresponding one of the n−1 compare signals.

5. The word line driving circuit of claim 4, wherein the n−1 clamp transistors include PMOS transistors, and a number of the PMOS transistors that are activated increases as the power supply voltage level decreases.

6. The word line driving circuit of claim 1, wherein the word line driver comprises:
   a junction capacitor coupled between the power supply voltage and a second node;
   an inverter coupled between the second node and a ground electrode and configured to invert the word line selecting signal to output an inverted word line selecting signal; and
   a pass transistor configured to transmit the inverted word line selecting signal output from the inverter to the word line.

7. A method of driving a word line, the method comprising:
   detecting a level of a power supply voltage in response to a read command;
   changing a capacitance in response to the detected level of the power supply voltage to compensate for a fluctuation of the power supply voltage;
   precharging a clamp capacitor with the power supply voltage; and
   distributing electric charges that are precharged in the clamp capacitor to the word line in response to a word line selecting signal.

8. The method of claim 7, wherein detecting the level of the power supply voltage comprises:
   providing the power supply voltage in response to a read command;
   generating n voltage-divided signals in response to the provided power supply voltage where n is a natural number; and
   comparing the n voltage-divided signals with a reference signal to generate n compare signals.

9. The method of claim 8, wherein changing the capacitance comprises:
   decreasing a number of activated n clamp transistors, when the level of the power supply voltage increases, in response to the n compare signals, the n clamp transistors being coupled to n unit clamp capacitors included in the clamp capacitor; and
   increasing the number of the activated n clamp transistors, when the level of power supply voltage decreases, in response to the n compare signals, and
   wherein the capacitance of the n unit clamp capacitors is varied according to the number of the activated n clamp transistors.

10. The method of claim 9, wherein precharging the clamp capacitor comprises:
    providing the power supply voltage to the n unit clamp capacitors through a corresponding one of the activated n clamp transistors in response to a precharge signal and to a charge sharing capacitor.

11. The method of claim 7, wherein distributing the electric charges comprises:
    precharging a pass transistor;
    providing the electric charges precharged in the clamp capacitor to an input stage of the pass transistor in response to the word line selecting signal;
    self-boosting the pass transistor by providing the electric charges to the input stage of the pass transistor; and
    distributing the electric charges to the word line through the self-boosted pass transistor.

12. A read voltage generator comprising:
    a level detector configured to detect a fluctuation of a power supply voltage level to generate a level detecting signal in response to a read command to stably generate a read voltage; and
    a charge sharing clamp circuit configured to precharge a clamp capacitor in response to the level detecting signal,
    wherein the capacitance of the clamp capacitor is varied to compensate for the fluctuation of the power supply voltage level.

13. The read voltage generator of claim 12, wherein the level detector comprises:
    a read control transistor coupled between a power supply voltage and a first node, and configured to switch in response to the read command;
    a voltage divider including n resistors coupled in series between a first node and a ground electrode, and configured to output n−1 voltage-divided signals, where n is a natural number greater than one; and
    n−1 comparators each configured to compare one of the n−1 voltage-divided signals with a reference signal to generate n−1 compare signals.

14. The read voltage generator of claim 13, wherein the charge sharing clamp circuit comprises:
    a precharge transistor coupled between the power supply voltage and a second node, and configured to be switched in response to a precharge signal;
    a charge sharing capacitor coupled between the second node and the ground electrode;
    n−1 unit clamp capacitors coupled in parallel between the second node and the ground electrode; and
    n−1 clamp transistors each of which is coupled between the second node and one of the n−1 unit clamp capacitors and configured to switch in response to a corresponding one of the n−1 compare signals.

* * * * *